(12) United States Patent
Kwak et al.

(10) Patent No.: US 8,321,640 B2
(45) Date of Patent: Nov. 27, 2012

(54) DATA MASK SYSTEM AND DATA MASK METHOD

(75) Inventors: Sang-hyup Kwak, Seoul (KR);
Kwang-il Park, Yongin-si (KR);
Seung-jun Bae, Hwaseong-si (KR)

(73) Assignee: Samsung Electronics Co., Ltd.,
Suwon-si, Gyeonggi-do (KR)

( * ) Notice: Subject to any disclaimer, the term of this patent is extended or adjusted under 35 U.S.C. 154(b) by 376 days.

(21) Appl. No.: 12/780,986

(22) Filed: May 17, 2010

(65) Prior Publication Data

US 2011/0030064 A1 Feb. 3, 2011

(30) Foreign Application Priority Data

Jul. 31, 2009 (KR) .................. 10-2009-0070676

(51) Int. Cl.
*G06F 12/00* (2006.01)
(52) U.S. Cl. ................. 711/154; 711/E12.001
(58) Field of Classification Search .......... None
See application file for complete search history.

(56) References Cited

U.S. PATENT DOCUMENTS

| | | | | |
|---|---|---|---|---|
| 5,307,314 A | * | 4/1994 | Lee | 365/189.04 |
| 5,708,820 A | * | 1/1998 | Park et al. | 713/323 |
| 6,088,760 A | * | 7/2000 | Walker et al. | 711/104 |
| 6,101,579 A | * | 8/2000 | Randolph et al. | 711/131 |
| 6,151,239 A | * | 11/2000 | Batra | 365/120 |
| 6,714,460 B2 | * | 3/2004 | LaBerge | 365/189.03 |
| 7,684,258 B2 | * | 3/2010 | Kanda et al. | 365/189.03 |
| 2007/0101073 A1 | * | 5/2007 | Macri et al. | 711/154 |
| 2008/0052474 A1 | * | 2/2008 | Xu et al. | 711/154 |
| 2008/0177931 A1 | | 7/2008 | Isaac et al. | |
| 2009/0097339 A1 | * | 4/2009 | Sohn et al. | 365/193 |

* cited by examiner

*Primary Examiner* — Edward Dudek, Jr.
*Assistant Examiner* — Ralph A Verderamo, III
(74) *Attorney, Agent, or Firm* — Volentine & Whitt, PLLC (57) ABSTRACT

A data mask system includes a processor providing control signals including a command signal, an address signal, and a data signal, a data mask processor receiving the control signals and providing either write data or masked data in response to the control signals, and generating data mask information and a data mask selection signal from at least one of the control signals, and a data mask register unit receiving the data mask selection signal, storing the data mask information, selecting a subset of the stored data mask information in response to the data mask selection signal, and returning selected data mask information to the data mask processor. The data mask processor receives the selected data mask information from the data mask register unit and provides the masked data as a result of performing a data mask operation on the data signal according to the selected data mask information.

16 Claims, 7 Drawing Sheets

| DM Load | | | | | | | | | | | | |
|---|---|---|---|---|---|---|---|---|---|---|---|---|
| DM Selection | | | | RFU | | | | | | | REG | |
| A0 | A1 | A2 | A3 | A4 | A5 | A6 | A7 | A8 | A9 | A10 | A11 | A12 |
| 1 | 1 | 1 | 1 | | | | | | | | 0 | 0 |

FIG. 2B

| WRITE | | | | | | | | | | | | |
|---|---|---|---|---|---|---|---|---|---|---|---|---|
| DM_NUM | | | | Address | | | | | | | | EN |
| A0 | A1 | A2 | A3 | A4 | A5 | A6 | A7 | A8 | A9 | A10 | A11 | A12 |
| 1 | 0 | 0 | 1 | CA | | | | | | | | 1 |

REG_SEL: A0–A3

DM_CON: A1–A12

DATA MASK SYSTEM AND DATA MASK METHOD

CROSS-REFERENCE TO RELATED APPLICATIONS

This application claims the benefit of Korean Patent Application No. 10-2009-0070676 filed on Jul. 31, 2009, the subject matter of which is hereby incorporated by reference.

BACKGROUND

The inventive concept relates to data mask systems and methods of performing write operations incorporating a data masking function (or data mask methods). More particularly, the inventive concept relates to data mask systems and data mask methods, wherein the data masking is performed in relation to address bits otherwise not used during a write operation command.

In order to perform a data mask operation, conventional dynamic random access memory (DRAM) uses a method of separately assigning a data mask pin, or a method of using a data mask command before (i.e., separate from) a write command.

However, according to the methods of separately assigning a data mask pin, at least one of very limited double in-line memory module (DIMM) pins must be assigned as a data mask pin. This is a waste of very useful hardware resources within DIMMs. Also, according to the methods of using a separate data mask command before a write command, an additional command cycle is required. This wastes time.

SUMMARY

The inventive concept provides a data mask system and a data mask method that does not require the designation of a special data mask pin, and do not require the use of an additional data mask command preceding a write command.

In certain embodiments of the inventive concept, a data mask system is provided comprising; a processor configured to provide control signals including at least one of a command signal, an address signal, and a data signal, a data mask processor configured to receive the control signals and provide either write data or masked data in response to the control signals, and further configured to generate data mask information and a data mask selection signal from at least one of the control signals, and a data mask register unit configured to receive the data mask selection signal, store the data mask information, select a subset of the stored data mask information in response to the data mask selection signal, and return the selected subset of data mask information to the data mask processor, wherein the data mask processor is further configured to receive the selected subset of data mask information from the data mask register unit and provide the masked data as a result of performing a data mask operation on the data signal according to the selected subset of data mask information.

In other embodiments of the inventive concept, a data mask method is provided and comprises; receiving control signals including a command signal, an address signal and a data signal, decoding the command signal and the address signal to determine whether the command signal is a write command signal or a data mask load command signal, upon determining that the command signal is a write command signal, determining whether data masking is enabled or disabled in accordance with a data mask enable signal included within the decoded address signal, upon determining that data masking is enabled, generating and outputting a data mask selection signal in accordance with a register selection signal included within the decoded address signal, selecting a subset of data mask information stored in a data mask register unit and outputting the selected subset of data mask information in accordance with the data mask selection signal, and outputting mask data as a result of a data mask operation performed on the data signal in accordance with the selected subset of data mask information, wherein the data mask enable signal and the register selection signal are included within bits of the decoded address signal only when the command signal is a write command signal.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF EMBODIMENTS

Certain embodiments of the inventive concept are illustrated in the attached drawings. However, the inventive concept may be variously embodied and should not be construed as being limited to only the illustrated embodiments. Throughout the drawings and the written description like reference numbers and labels denote like or similar elements.

Figure 1:
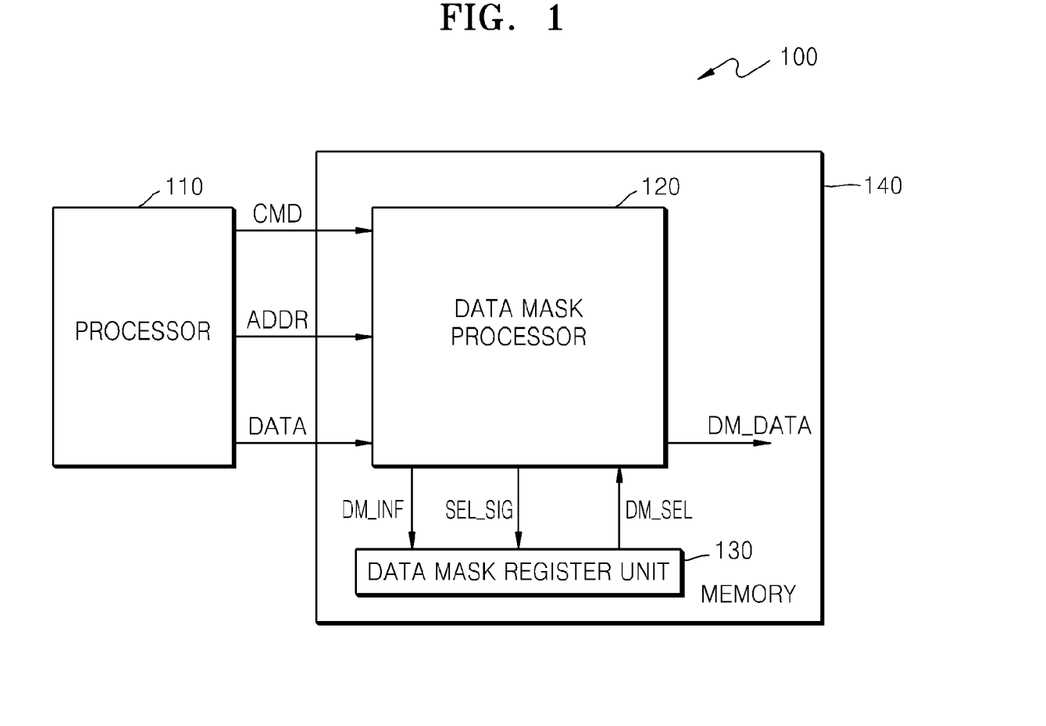
FIG. 1 is block diagram of a data mask system according to an embodiment of the inventive concept.

FIG. (FIG.) 1 is block diagram of a data mask system 100 according to an embodiment of the inventive concept. Referring to FIG. 1, the data mask system 100 comprises a processor 110, a data mask processor 120, and a data mask register unit 130. In certain embodiments of the inventive concept, at least the data mask processor 120 and data mask register unit 130 may be commonly integrated within a semiconductor memory device 140.

The processor 110 may be a general-purpose processor or similar device capable of providing control signals including at least one of a command signal (CMD), an address signal (ADDR), and a data signal (DATA) to the data mask processor 120. As is conventionally understood, the command signal CMD communicates a current operation command to the semiconductor memory device 140, the address signal ADDR indicates a corresponding memory address, and the data signal DATA provides, as needed, corresponding data (e.g., data to be written or programmed to the semiconductor memory device 140, or write data).

In the illustrated embodiment of FIG. 1, when the data mask processor 120 receives certain types of commands as indicated by the command signal CMD and related address signal ADDR from the processor 110, the semiconductor memory device 140 performs a data mask load operation or a data mask operation.

During execution of the data mask load operation, the data mask register unit 130 stores data mask information (DM_INF) received from the data mask processor 120. In one embodiment of the inventive concept, the data mask register unit 130 comprises at least one register configured to store the data mask information DM_INF.

During execution of the data mask operation, the data mask register unit 130 selects certain data mask information (e.g., a subset of the data mask information DM_INF stored in the data mask register unit 130, hereafter referred to as the selected data mask information DM_SEL) in accordance with a data mask selection signal (SEL_SIG) received from the data mask processor 120. The data mask register unit 130 then returns the selected data mask information DM_SEL to the data mask processor 120.

An exemplary data mask load operation and the data mask operation will now be described in some additional detail with reference to FIG. 1.

As previously noted, the data mask load operation pre-registers the data mask information DM_INF in the data mask register unit 130. The data mask information DM_INF typically includes information identifying one or more "masking bit(s)" used during the subsequently performed data mask operation. For example, assuming 1 byte of data mask information DM_INF, the data mask information DM_INF may include 8 bits (e.g., "11110000").

The data mask processor 120 stores the data mask information DM_INF in the data mask register unit 130 according to at least one of the address signal ADDR and data signal DATA when it is determined that a current command signal CMD indicates a data mask load command. For example, the current command signal CMD may indicate a data mask load command by decoding the command signal CMD and/or the address signal ADDR.

Figure 2A:
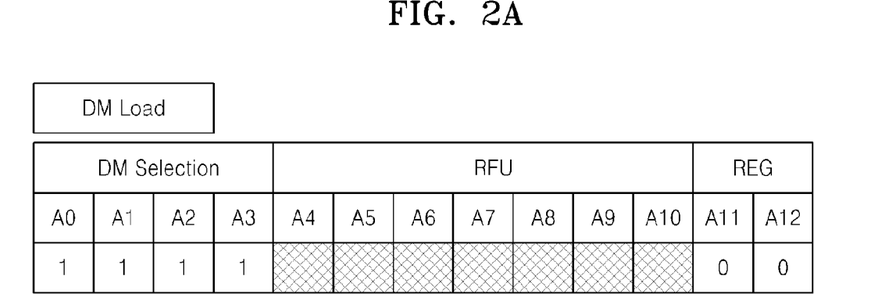
FIG. 2A is a diagram of an address signal during performing of a data mask load operation, in the data mask system of FIG. 1, according to an embodiment of the inventive concept.

FIG. 2A is a conceptual diagram of the address signal ADDR indicating a data mask load operation within the data mask system 100 according to an embodiment of the inventive concept. Referring to FIGS. 1 and 2A, the data mask processor 120 selects the data mask information DM_INF to be stored in the data mask register unit 130 using a plurality of data mask (DM) selection bits (e.g., A0, A1, A2, and A3) provided with the address signal ADDR. The data mask processor 120 also determines an address within the data mask register unit 130 to store the data mask information DM_INF using register (REG) address bits (e.g., A11 and A12) provided in the address signal ADDR.

Thus, in the example illustrated in FIG. 2A, the data mask register unit 130 includes four (4) sub-registers, wherein whether which one of the four (4) sub-registers may be used to store the data mask information DM_INF is determined by the register address bits A11 and A12. In FIG. 2A, the remaining data bits (RFU) of the address signal ADDR (e.g., A4 through A10) are not used during the data mask load operation.

Of further note, the data mask information stored in the data mask register unit 130 by the embodiment of FIG. 2A is provided via the address signal ADDR received from the processor 110 during a data mask load operation. However, the data mask information may alternatively be provided via the data signal DATA received from the processor 110 during the data mask load operation.

In one embodiment of the inventive concept, the data mask load operation is performed during an initialization period of the data mask system 100, or during operation of the data mask system 100 in response to a data mask load command signal. When the data mask load operation is performed during the initialization period of the data mask system 100, the data mask processor 120 stores initial data mask information in the data mask register unit 130. Alternatively, when the data mask load operation is performed during the operation of the data mask system 100, the data mask information initially stored in the data mask register unit 130 may be updated. An exemplary data mask load operation will be described hereafter with reference to FIGS. 5A and 5B in some additional detail.

The data mask operation performs a data masking function on the data signal DATA received from the processor 110 in accordance with the selected data mask information DM SEL returned from the data mask register unit 130. The data mask processor 120 then provides "masked data" as an output (DM_DATA) as a result of the data masking function. The masked data DM_DATA provided by the data mask processor 120 may be written to a memory address indicated by the address signal ADDR within a memory array (not shown) of the semiconductor memory device 140 according to a conventionally understood write or program operation, for example.

The data mask processor 120 determines whether the data masking function is enabled or disabled, for example, by decoding a portion of the address signal ADDR, when a current command signal CMD is determined to be a write command signal. If data masking is enabled, a data mask operation is performed before the write operation indicated by the write command signal. However, if data masking is disabled, a "normal" write operation, as indicated by the write command signal is performed.

Figure 2B:
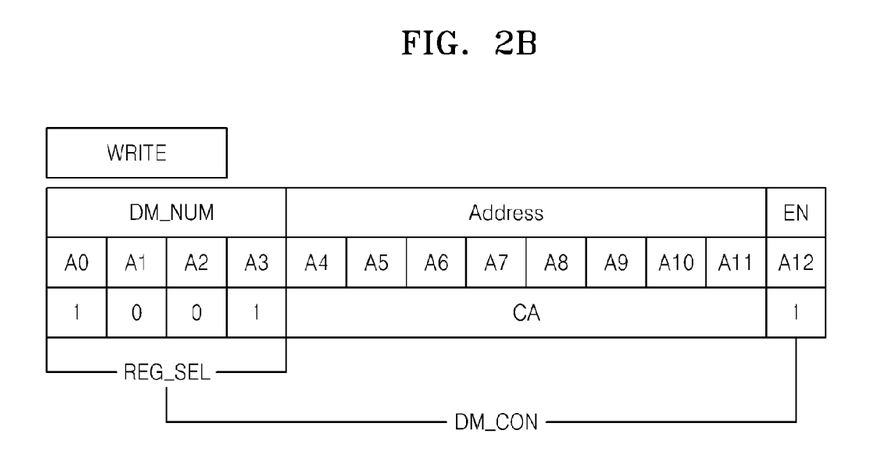
FIG. 2B is a diagram of an address signal during performing of a data mask operation, in the data mask system of FIG. 1, according to an embodiment of the inventive concept.

FIG. 2B is another conceptual diagram of the address signal ADDR received by an embodiment of the inventive concept during a data mask operation. Referring to FIG. 2B, the address signal ADDR includes a data mask control signal DM_CON (e.g., address signal ADDR bits A0, A1, A2, A3, and A12). That is, the data mask control signal DM_CON may be included in bits of the address signal ADDR that are not normally used during a write operation. Assuming an address signal ADDR of 13 bits (e.g., A0 through A12), only 8 bits (e.g., A4 through A11) among the 13 bits are needed to indicate a 1 byte write address. Thus, the regular address signal ADDR communicated from the processor 110 to the semiconductor memory device 140 during a write command provides extra (or unused) bits that may be used to provide the data mask control signal DM_CON (e.g., A0, A1, A2, A3, and A12 in the illustrated example). Of course the number of bits available to indicate the data mask control signal DM_CON will vary according to the control signal definitions (e.g., the address signal ADDR, the command signal CMD and/or the data signal DATA) and the architecture of the mask system 100.

The data mask control signal DM_CON may include a data mask enable signal EN and a register selection signal REG_SEL. The data mask processor 120 determines whether or not a data mask operation is to be performed based on the data mask enable signal EN decoded from the address signal ADDR. For example, when the data mask enable signal EN is "1", the data mask operation is to be performed (i.e., a write operation with data masking is to be performed), and when the data mask enable signal EN is "0", the data mask operation is not to be performed (i.e., a normal write operation is to be performed, such that normal "write data" is provided from the semiconductor memory device 140, as compared with "mask data").

Once it is determined that the data mask operation is to be performed based on the data mask enable signal EN, the data mask processor 120 generates the data mask selection signal SEL_SIG on the basis of the register selection signal SEL_SIG included within the data mask control signal DM_CON, and then provides the data mask selection signal SEL_SIG to the data mask register unit 130.

In response to the data mask selection signal SEL_SIG, the data mask register unit 130 selects (e.g.) a subset of the data mask information DM_INF stored in the data mask register unit 130 and then returns the selected subset of the data mask information DM_INF as the selected data mask information DM_SEL to the data mask processor 120.

The data mask processor 120 receives the selected data mask information DM_SEL from the data mask register unit 130, and outputs a result of performing a data mask operation on the data signal DATA according to the selected data mask information DM_SEL as the masked data DM_DATA. An exemplary data mask operation will now be described in some additional detail with reference to FIGS. 6 and 7.

Figure 3:
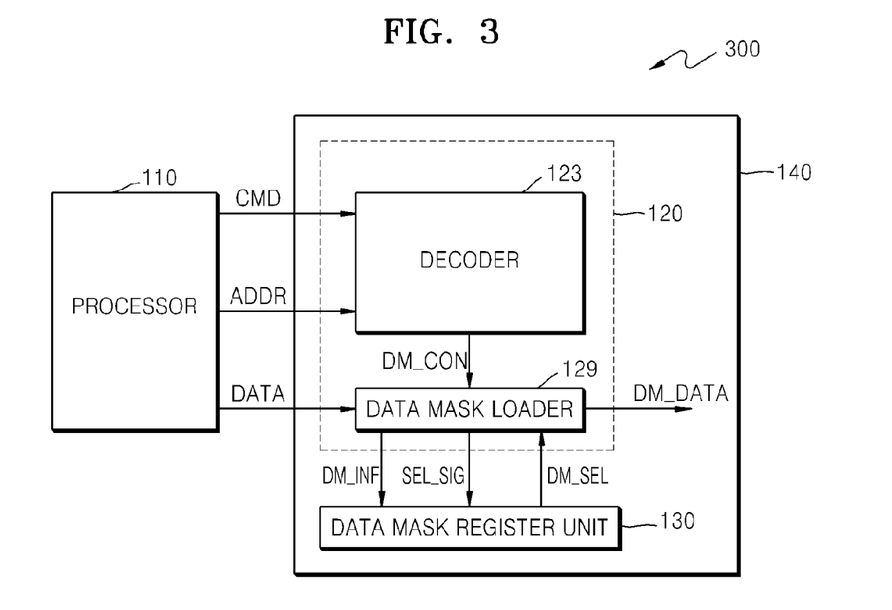
FIG. 3 is a block diagram of a data mask system according to another embodiment of the inventive concept.

FIG. 3 is a diagram of a data mask system 300 according to another embodiment of the inventive concept. Referring to FIG. 3, the data mask system 300 again comprises the processor 110, data mask processor 120, and data mask register unit 130. However, the data mask processor 120 is further illustrated as comprising a decoder 123 and a data mask loader 129.

Referring to FIG. 3, the decoder 123 receives and decodes the command signal CMD and the address signal ADDR received from the processor 110.

When a current command signal CMD is determined to be a write command signal, the data mask control signal DM_CON included within (e.g.) the address signal ADDR is provided to the data mask loader 129. For example, referring to FIG. 2B, available unused address signal ADDR bits A0, A1, A2, A3, and A12 may be provided to the data mask loader 129 as the data mask control signal DM_CON.

The data mask loader 129 receives the data mask control signal DM_CON, and determines whether data masking is enabled or disabled according to the data mask enable signal EN included within the data mask control signal DM_CON. If data masking is enabled, the data mask loader 129 generates the data mask selection signal SEL_SIG according to the register selection signal REG_SEL included within the data mask control signal DM_CON, and provides the data mask selection signal SEL_SIG to the data mask register unit 130.

When it is determined that the current command signal CMD is a data mask load command signal (e.g., by decoding the command signal CMD and/or a corresponding address signal ADDR), the decoder 123 provides selected bits of (e.g.) the address signal ADDR to the data mask loader 129 as the data mask control signal DM_CON. For example, referring to FIG. 2A, if it is determined that the current command signal CMD is a data mask load command signal, address signal ADDR bits A0, A1, A2, A3, A11, and A12 may be provided to the data mask processor 120 as the data mask control signal DM_CON.

The data mask loader 129 receives the data mask control signal DM_CON, and selects a subset of the data mask information to be stored in the data mask register unit 130 using the bits A0, A1, A2, and A3 (DM selection bits) of the data mask control signal DM_CON. The data mask loader 129 determines an address within the data mask register unit 130 at which to store the selected subset of the data mask information using other bits A11 and A12 (register address bits—REG) of the data mask control signal DM_CON. In other words, the data mask loader 129 stores the data mask information DM_INF in an assigned register location within the data mask register unit 130 according to the data mask control signal DM_CON.

The structures and related operation of the processor 110 and data mask register unit 130 of FIG. 3 are assumed to be similar to those of FIG. 1. Accordingly, a detailed description will be omitted here.

Figure 4:
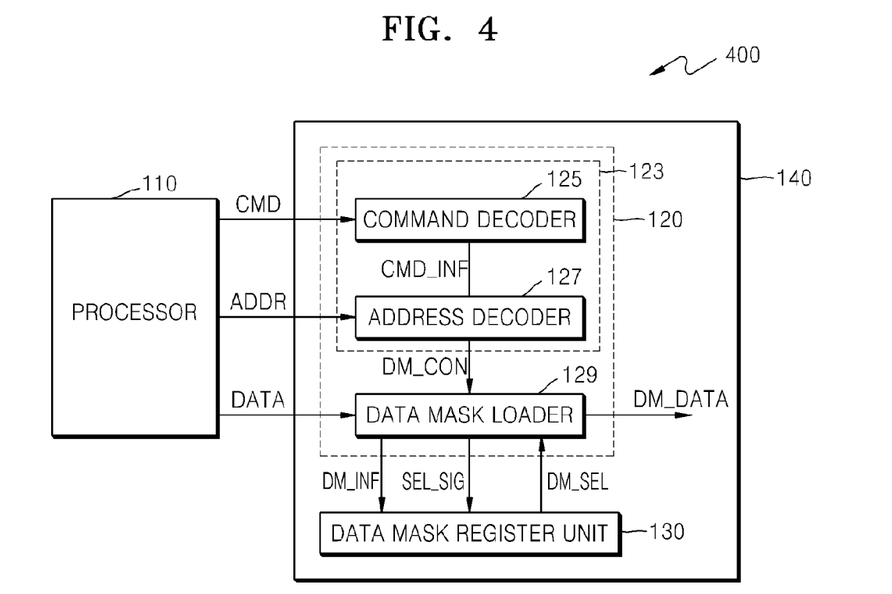
FIG. 4 is a diagram of a data mask system according to another embodiment of the inventive concept.

FIG. 4 is a diagram of a data mask system 400 according to yet another embodiment of the inventive concept. Referring to FIG. 4, the data mask system 400 comprises the processor 110, data mask loader 129, and data mask register unit 130 as previously described. However, the decoder 123 is further illustrated as comprising separate command decoder 125 and address decoder 127. The command decoder 125 is configured to receive the command signal CMD from the processor 110, decode the command signal CMD, and output a command decoding result to the address decoder 127 as command information CMD_INF.

The address decoder 127 is configured to receive the address signal ADDR from the processor 110, and the command information CMD_INF from the command decoder 125. When it is determined that the command signal CMD is a write command signal according to the command information CMD_INF, the address decoder 127 provides the data mask control signal DM_CON included within (e.g.,) the address signal ADDR to the data mask loader 129. For example, referring to FIG. 2B, some bits A0, A1, A2, A3, and A12 of the address signal ADDR may be output to the data mask loader 129 as the data mask control signal DM_CON.

Alternatively, when the command signal CMD is determined to be a data mask load command signal according to the command information CMD_INF, the address decoder 127 provides selected bits of the address signal ADDR to the data mask loader 129 as the data mask control signal DM_CON. For example, referring to FIG. 2A, if it is determined that the command signal CMD is a data mask load command signal, some bits A0, A1, A2, A3, A11, and A12 of the address signal ADDR may be output to the data mask loader 129 as the data mask control signal DM_CON.

The structures and related operation of the processor 110, data mask loader 129, and data mask register unit 130 of FIG. 4 are assumed to be similar to those of FIG. 3, and thus descriptions are not repeated.

Figure 5A:
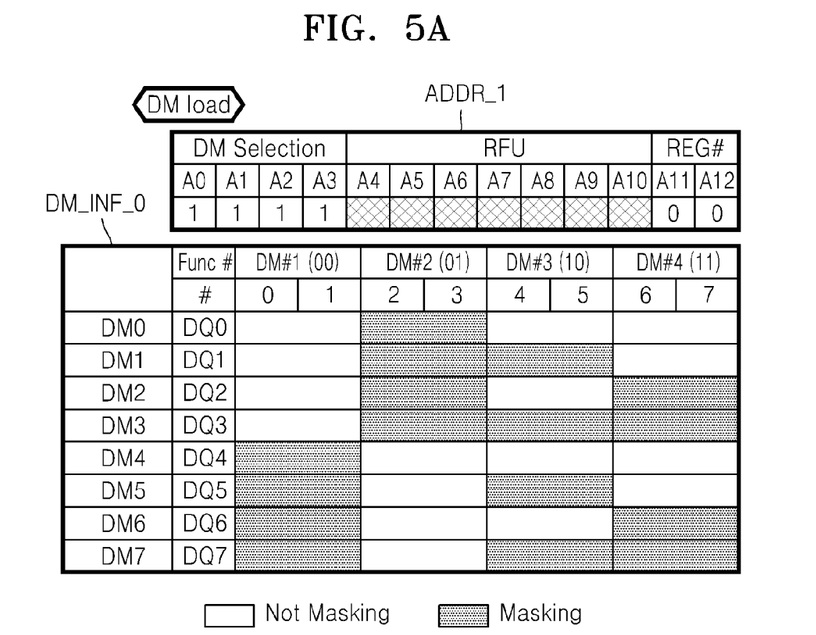
FIGS. 5A and 5B are diagrams for describing a data mask load operation according to an embodiment of the inventive concept.
Figure 5B:
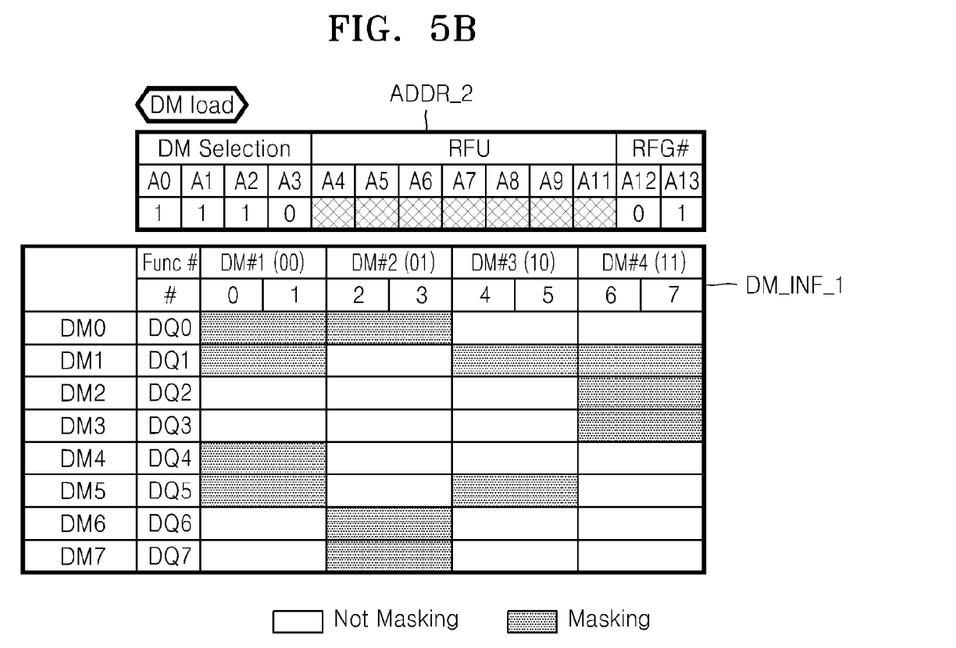

FIGS. 5A and 5B are conceptual diagrams further describing a data mask load operation according to an embodiment of the inventive concept. FIGS. 5A and 5B respectively illustrate address signals ADDR_1 and ADDR_2, and data mask information DM_INF_0 and DM_INF_1 stored in a register during execution of a data mask load operation. The data mask load operation further illustrated in FIGS. 5A and 5B may be executed by any one of data mask systems 100, 300, and 400 of FIGS. 1, 3, and 4. In FIGS. 5A and 5B, the data mask register unit 130 is assumed to include four (4) registers, but the number of registers forming a particular embodiment of the data mask register unit 130 may vary by design.

FIG. 5A illustrates the data mask information DM_INF_0 stored in a zeroth register, when a data mask load command signal as the command signal CMD and the address signal ADDR_1 are input. In other words, as described with reference to FIG. 2, when the address signal ADDR_1 is input to the data mask processor 120, the data mask processor 120 may determine which register in the data mask register unit 130 to store the data mask information DM_INF_0 using the bits A11 and A12 (REG) of the address signal ADDR_1. In FIG. 5A, the data mask register unit 130 includes four (4) registers, and the data mask processor 120 may determine which register from among the four (4) registers of the data mask register unit 130 to store the data mask information DM_INF_0 using the bits A11 and A12. Since the bits A11 and A12 of the address signal ADDR_1 of FIG. 5A are "00", the data mask information DM_INF_0 is stored in the zeroth register.

When it is determined that the data mask information DM_INF_0 is to be stored in the zeroth register, the data mask processor 120 selects a subset of the data mask information DM_INF_0 to be stored in the zeroth register of the data mask register unit 130 using the bits A0, A1, A2, and A3 (DM Selection bits) of the address signal ADDR_1.

As shown in FIG. 5A, the bits A0, A1, A2, and A3 of the address signal ADDR_1 are "1111", and the subset of the data mask information DM_INF_0 corresponding to the bits A0, A1, A2, and A3 are stored in the zeroth register. In FIG. 5A, the selected subset of the data mask information DM#1, DM#2, DM#3, and DM#4 are stored in the zeroth register. Since "Not Masking" denotes "0", and "Masking" denotes "1", the data mask information DM#1 denotes "00001111", the data mask information DM#2 denotes "11110000", the data mask information DM#3 denotes "01010101", and the data mask information DM#4 denotes "00110011". However, the subset of the data mask information DM_INF_0 corresponding to the bits A0, A1, A2, and A3 of the address signal ADDR_1 is not limited thereto, and may vary. The subset of the data mask information DM_INF_0 corresponding to the bits A0, A1, A2, and A3 of the address signal ADDR_1 may be stored in the data mask processor 120 of FIG. 1, or in the data mask loader 129 of FIG. 3 or 4.

FIG. 5B illustrates the mask data information DM_INF_1 stored in a first register when the data mask load command signal and the address signal ADDR_2 are input. FIG. 5B is similar to FIG. 5A, except a register to store data mask information and the data mask information stored in the register are different. In other words, the bits A11 and A12 (REG) of the address signal ADDR_2 are "01", and thus indicate the first register. Also, the bits A0, A1, A2, and A3 (DM Selection bits) of the address signal ADDR_2 are "1110". In FIG. 5B, the subset of the data mask information DM_INF_1 corresponding to the bits A0, A1, A2, and A3 of the address signal ADDR_2 are stored in the first register. Accordingly, the subset of the data mask information DM#1, DM#2, DM#3, and DM#4 is stored in the first register, wherein the data mask information DM#1 indicates "11001100", the data mask information DM#2 indicates "10000011", the data mask information DM#3 indicates "01000100", and the data mask information DM#4 indicates "01110000". The pieces of the data mask information DM_INF_1 corresponding to the bits A0, A1, A2, and A3 of the address signal ADDR_2 may be stored in the data mask processor 120 of FIG. 1, or in the data mask loader 129 of FIG. 3 or 4.

In other words, the subset of the data mask information DM_INF corresponding to the bits A0, A1, A2, and A3 of the address signal ADDR may be stored in the data mask processor 120 of FIG. 1, or in the data mask loader 129 of FIG. 3 or 4.

Meanwhile, the address signals ADDR_1 and ADDR_2 of FIG. 5A and 5B are only examples, and the number of bits of an address signal and bits (DM Selection, RFU, and REG) of the address signal ADDR may vary.

According to another embodiment of the inventive concept, the data mask processor 120 may determine the data mask information DM_INF to be stored in the data mask register unit 130 according to the data signal DATA received from the processor 110. In other words, the data mask processor 120 selects a register to store the data mask information DM_INF by using the bits A11 and A12 of the address signal ADDR, but may determine the data mask information DM_INF to be stored in the register based on the data signal DATA instead of the bits A0, A1, A2, and A3 of the address signal ADDR.

Figure 6:
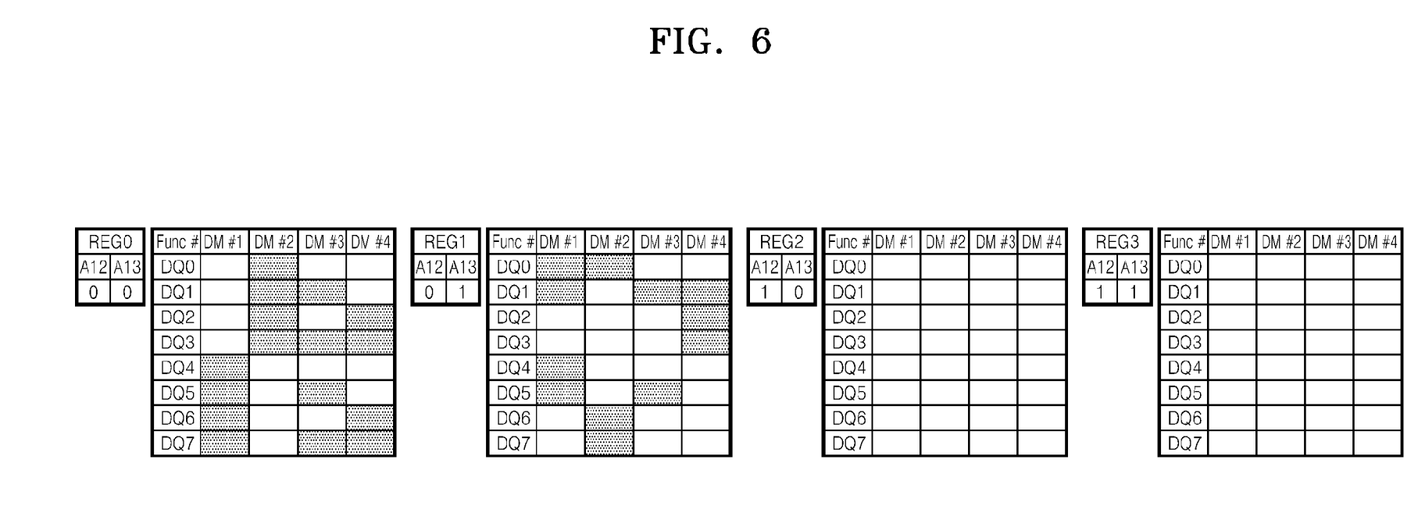
FIG. 6 is a diagram illustrating data mask information stored in a data mask register unit according to the data mask load operation of FIGS. 5A and 5B.

FIG. 6 is a conceptual diagram further illustrating data mask information stored in the data mask register unit 130 in accordance with the data mask load operation of FIGS. 5A and 5B.

Referring to FIG. 6, the data mask information DM_INF_0 of FIG. 5A may be stored in a zeroth register REG0, and the data mask information DM_INF_1 of FIG. 5B may be stored in a first register REG1. Also, a second register REG2 and a third register REG3 may not store data mask information.

Figure 7:
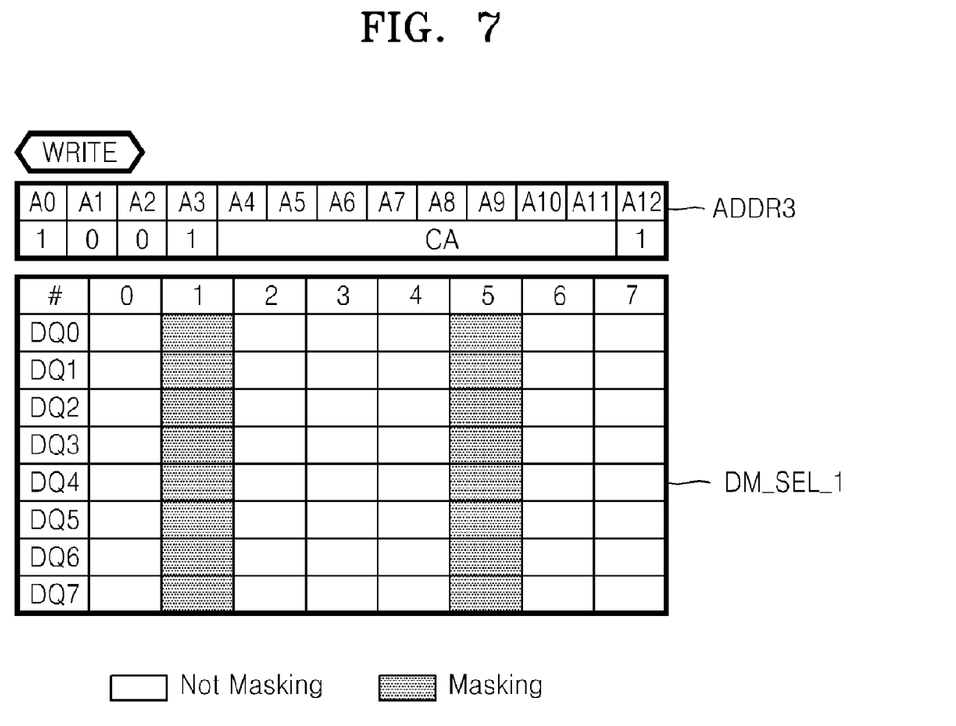
FIG. 7 is a diagram for describing a data mask operation according to an embodiment of the inventive concept.

FIG. 7 is a conceptual diagram further describing a data mask operation according to an embodiment of the inventive concept. The data mask operation of FIG. 7 may be performed by any one of the data mask systems 100, 300, and 400 of FIGS. 1, 3, and 4. In FIG. 7, the data mask information of FIG. 6 is stored in the data mask register unit 130 according to a data mask load operation.

Referring to FIG. 7, the data mask operation is performed according to selected data mask information DM_SEL_1, when a write command and an address signal ADDR3 are input. The address signal ADDR3 may include a data mask control signal using bits A0, A1, A2, A3, and A12. The data mask control signal may include a register selection signal using bits A0, A1, A2, and A3, and a data mask enable signal using a bit A12. Remaining bits A4 through A11 of the address signal ADDR3 may indicate a write address of a semiconductor memory device to write the data signal DATA.

Referring to FIGS. 2A and 7, since the bit A12 of the data mask enable signal input with the write command is 1, the data mask operation is performed with the write command. Here, the register selection signal using the bits A0, A1, A2, and A3 is a signal for selecting a piece of data mask information to be used in the data mask operation from among the data mask information DM_INF stored in the data mask register unit 130. In detail, the bits A2 and A3 from among the bits A0, A1, A2, and A3 of the register selection signal may be a signal indicating which register is to be selected from among the registers of the data mask register unit 130. Also, the remaining bits A0 and A1 of the register selection signal may be a signal indicating which piece of data mask information is to be selected from among the data mask information DM INF stored in the register selected. In FIG. 7, since the bits A2 and A3 are "01", a first register is selected, and since the bits A0 and A1 are "10", data mask information DM#3 of the first register may be selected.

In other words, when the bits A0, A1, A2, and A3 of the register selection signal are "1001", the register selection signal denotes the data mask information DM#3 of the first register in the data mask register unit 130. Accordingly, the data mask information DM#3 is "01000100". Thus, the data mask operation is performed according to the data mask information DM#3, i.e., "01000100".

Figure 8:
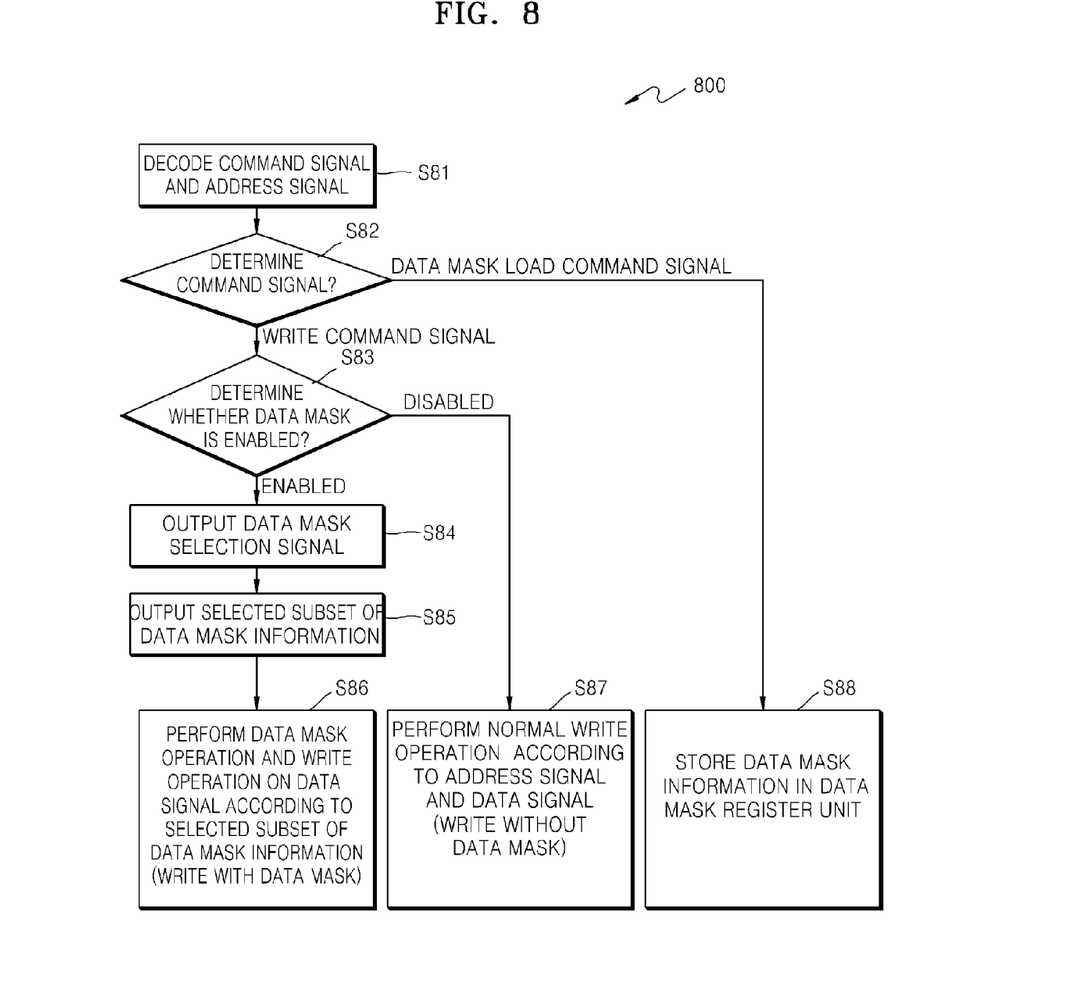
FIG. 8 is a flowchart summarizing a data mask method according to an embodiment of the inventive concept.

FIG. 8 is a flowchart summarizing a data mask operation method 800 according to an embodiment of the inventive concept. According to the data mask method 800, a command signal and an address signal received from a processor are decoded (S81), and the nature of the command signal is determined (S82). If the command signal is determined to be a write command signal, it is next determined whether data masking is enabled or disabled (S83). This determination may be made, for example, according to a data mask enable signal included in the address signal.

If it is determined that the data mask is enabled (S83=enabled), a data mask selection signal is generated and output (S84). In certain embodiments of the inventive concept the data mask selection signal will be decode from the address signal corresponding to the current command signal. Once the data mask selection signal has been output, a subset of the data mask information stored in the data mask register unit 130 is selected according to the data mask selection signal and the selected subset of data mask information is output (S85). Then, a result of performing a data mask operation on a data signal received from the processor according to the selected subset of data mask information is output (S86). The data mask enable signal and the register selection signal may be included in bits of the address signal that are not used during a write command.

Alternatively, if it is determined that the command signal is a data mask load command signal (S82), data mask information according to at least one of the address signal and the data signal is stored in the data mask register unit (S88).

Also, if it is determined that data masking is disabled (S83), a normal write operation is performed (S87) according to the address signal and the data signal.

While the inventive concept has been particularly shown and described with reference to exemplary embodiments thereof, it will be understood that various changes in form and details may be made therein without departing from the scope of the following claims.

What is claimed is:

1. A data mask system comprising:
a processor configured to provide control signals including at least one of a command signal, an address signal, and a data signal;
a data mask processor configured to receive the control signals and provide either write data or masked data in response to the control signals, and further configured to generate data mask information and a data mask selection signal from at least one of the control signals; and
a data mask register unit configured to receive the data mask selection signal, store the data mask information, select a subset of the stored data mask information in response to the data mask selection signal, and return the selected subset of data mask information to the data mask processor,
wherein the data mask processor is further configured to receive the selected subset of data mask information from the data mask register unit and provide the masked data as a result of performing a data mask operation on the data signal according to the selected subset of data mask information.

2. The data mask system of claim 1, wherein the address signal received with a write command signal comprises a data mask control signal and a write address.

3. The data mask system of claim 2, wherein the data mask processor is further configured to determine whether data masking is enabled or disabled in relation to the write command signal by decoding at least a portion of the address signal.

4. The data mask system of claim 2, wherein the data mask control signal comprises a data mask enable signal and a register selection signal, and
the data mask processor is further configured to determine whether the command signal is a write command signal, and upon determining that the command signal is a write command signal, the data mask processor is further configured to determine whether data masking is enabled or disabled in accordance with the data mask enable signal.

5. The data mask system of claim 4, wherein upon determining that data masking is enabled, the data mask processor is further configured to generate and output the data mask selection signal in accordance with the register selection signal.

6. The data mask system of claim 2, wherein the data mask control signal comprises a data mask enable signal and a register selection signal, and
the data mask processor comprises:
a decoder configured to receive and decode the command signal and the address signal, and output the data mask control signal included in the decoded address signal upon determining that the command signal is a write command signal; and
a data mask loader configured to receive the data mask control signal, determine whether data masking is enabled or disabled in accordance with the data mask enable signal, and generate the data mask selection signal in accordance with the register selection signal when data masking is determined to be enabled.

7. The data mask system of claim 6, wherein the decoder comprises:
a command decoder configured to receive and decode the command signal and provide command information from the decoded command signal; and
an address decoder configured to receive the address signal and the command information, and provide the data mask control signal from the decoded address signal to the data mask loader upon determining that the command signal is a write command signal.

8. The data mask system of claim 1, wherein the data mask processor and the data mask register unit are commonly integrated in a semiconductor memory device.

9. The data mask system of claim 1, wherein the data mask information is derived from at least one of the address signal and the data signal.

10. The data mask system of claim 1, wherein the data mask processor is further configured to determine whether the command signal is a data mask load command signal by decoding the command signal and the address signal.

11. The data mask system of claim 10, wherein the data mask processor is further configured to store data mask information in the data mask register unit upon determining that the command signal is a data mask load command signal.

12. The data mask system of claim 1, wherein the data mask processor is further configured to determine whether the command signal is a normal write command by decoding the command signal and the address signal.

13. The data mask system of claim 12, wherein the data mask processor is further configured to perform a normal write operation upon determining that the command signal is a normal write command.

14. A data mask method comprising:
receiving control signals including a command signal, an address signal and a data signal;
decoding the command signal and the address signal to determine whether the command signal is a write command signal or a data mask load command signal;
upon determining that the command signal is a write command signal, determining whether data masking is enabled or disabled in accordance with a data mask enable signal included within the decoded address signal;

upon determining that data masking is enabled, generating and outputting a data mask selection signal in accordance with a register selection signal included within the decoded address signal;

selecting a subset of data mask information stored in a data mask register unit and outputting the selected subset of data mask information in accordance with the data mask selection signal; and outputting mask data as a result of a data mask operation performed on the data signal in accordance with the selected subset of data mask information, wherein the data mask enable signal and the register selection signal are included within bits of the decoded address signal only when the command signal is a write command signal.

15. The data mask method of claim 14, wherein upon determining that the command signal is a data mask load command signal the method further comprises:

loading the data mask information in the data mask register unit.

16. The data mask method of claim 14, upon determining that the command signal is a command signal and data masking is disabled, the method further comprises:

performing a normal write operation in relation to the data signal without data masking.

* * * * *